(12) United States Patent
Rothenberger

(10) Patent No.: US 7,973,589 B2
(45) Date of Patent: Jul. 5, 2011

(54) MICRO-CONTROLLER-BASED ELECTRONIC SWITCH USING A PROXIMITY DETECTOR TO FACILITATE HANDS-FREE CONTROL OF AN AC DEVICE

(76) Inventor: David C. Rothenberger, Winnipeg (CA)

( * ) Notice: Subject to any disclaimer, the term of this patent is extended or adjusted under 35 U.S.C. 154(b) by 54 days.

(21) Appl. No.: 12/501,045

(22) Filed: Jul. 10, 2009

(65) Prior Publication Data

US 2011/0006833 A1 Jan. 13, 2011

(51) Int. Cl.
*H03K 17/96* (2006.01)
*H03K 17/945* (2006.01)
(52) U.S. Cl. .................... 327/517; 315/194
(58) Field of Classification Search ............. None
See application file for complete search history.

(56) References Cited

U.S. PATENT DOCUMENTS

| | | | | |
|---|---|---|---|---|
| 4,168,443 A * | 9/1979 | Periot | ................... | 327/517 |
| 5,416,404 A * | 5/1995 | Baldwin | ................... | 323/235 |
| 5,557,173 A * | 9/1996 | Kuo | ................... | 315/158 |
| 5,712,558 A | 1/1998 | Sanit-Cyr et al. | | |
| 5,831,391 A * | 11/1998 | MacKay | ................... | 315/159 |
| 6,252,786 B1 * | 6/2001 | Ahn | ................... | 363/84 |
| 6,300,748 B1 | 10/2001 | Miller | | |
| 6,356,038 B2 | 3/2002 | Bishel | | |
| 6,369,517 B2 | 4/2002 | Song et al. | | |
| 6,456,015 B1 * | 9/2002 | Lovell et al. | ................... | 315/248 |
| 7,115,856 B2 | 10/2006 | Peng et al. | | |

OTHER PUBLICATIONS

LSI Computer Systems, Inc., Dec. 2000, Touch Control Lamp Dimmer.
Marty Brown, 119, Common Topologies, Switchmode: A Designer's Guide for Switching Power Supply Circuits and Components—1992, p. 6.

* cited by examiner

*Primary Examiner* — Tuan Lam
(74) *Attorney, Agent, or Firm* — Kyle R. Satterthwaite; Ryan W. Dupuis; Ade & Company Inc.

(57) ABSTRACT

This system is a no touch single pole single throw (spst) two wire electronic light switch that uses an Infrared Proximity Detector to create a working system designed to replace existing mechanical switches common in households. The use of a Micro Controller enables the system to adapt to different loads and load types while requiring a minimum number of parts to perform the necessary tasks.

20 Claims, 8 Drawing Sheets

Hands Free Infrared Two Wire Light Switch - Block Diagram

Hands Free Infrared Two Wire Light Switch - General Design

HV Switch - Design Example

Infrared Proximity Detector - Block Diagram

Multiple Switch Connection Architecture

Hands Free Infrared Two Wire Light Switch using Buck Regulator Topology

Hands Free Infrared Two Wire Light Switch - General Design

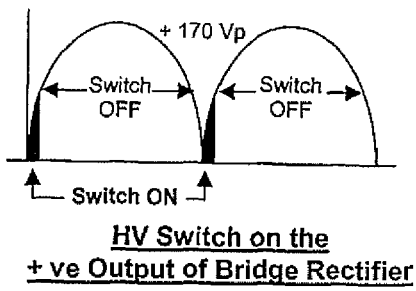
**HV Switch on the
+ ve Output of Bridge Rectifier**
FIG. 9
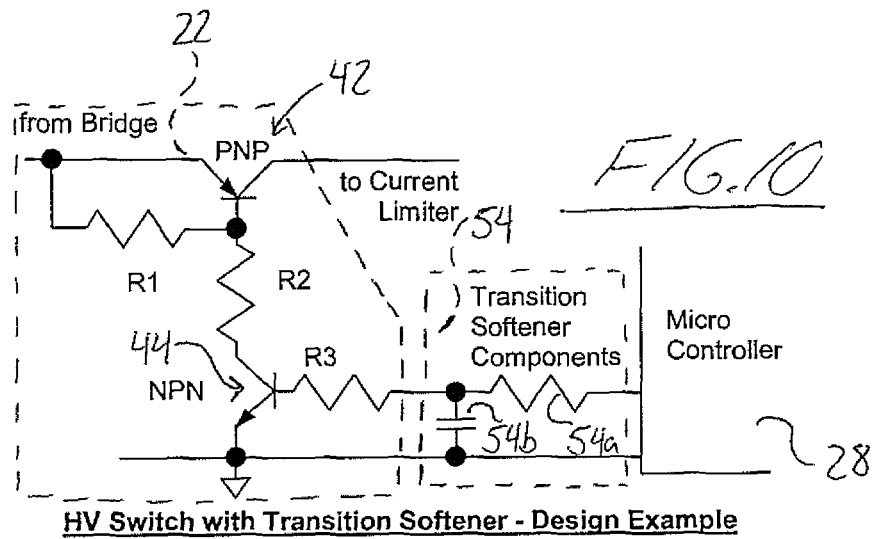
FIG. 10
HV Switch with Transition Softener - Design Example
FIG. 11
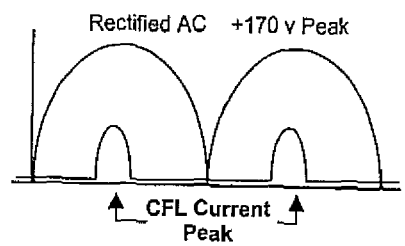
**Compact Florescent Light
Current Pattern vs. Commercial AC**

Micro Controller Input Protection

MICRO-CONTROLLER-BASED ELECTRONIC SWITCH USING A PROXIMITY DETECTOR TO FACILITATE HANDS-FREE CONTROL OF AN AC DEVICE

FIELD OF THE INVENTION

The present invention relates generally to electronic AC power switches, and more particularly to switches of this type incorporating a proximity detector in order to switch the AC load between on and off states in response to detection of an object proximate the switch.

BACKGROUND OF THE INVENTION

Conventional light switches are mechanical single pole single throw switches that operate when two metallic contacts are brought together. To activate the mechanical switch an electrically isolated actuator must be moved by direct human touch; i.e. someone must physically flip the switch. As a result, light switches are amongst the dirtiest places. In medical facilities and nursing homes this is an issue. From a health standpoint, a light switch that does not need to be touched would help minimize the transfer of germs.

Most electronic switches, dimmers and timers require at least three wires to operate. There is the incoming power consisting of a hot and a neutral as well as the connection to the load being controlled, which also consists of a hot wire and a neutral. The neutral is common to both the incoming power and the load being controlled, so the total number of wires is three. But many existing mechanical light switches only have a pair of wires routed to them. It is quite costly and time consuming to rewire a light switch location for three wire operation.

Applicant has developed a proximity-actuated electronic switch requiring only two wires and providing, at minimum, the same load control functionality as a single pole single throw mechanical light switch.

SUMMARY OF THE INVENTION

According to one aspect of the invention there is provided an electronic switch for selective control over power to be applied to an AC device from an AC power source through an AC power line comprising:

a pair of terminals connectable to the AC power line in series between the AC power source and the AC device;

a triac coupled between the pair of terminals to form a conductive connection therebetween when triggered by a gate pulse and retain said conductive connection between the terminals until a current level through the triac drops below a minimum level required to maintain conductivity of the triac;

a rectifier coupled to the terminals to generate a rectified DC voltage at an output of the rectifier when the pair of terminals are connected to the AC power line;

a switching arrangement coupled to the output of the rectifier;

a primary storage element coupled to the switching arrangement to build a charge in the primary storage element when the switching arrangement is in a conductive state between the rectifier output and the primary storage element;

a micro-controller coupled to the primary storage element to draw current from the charge thereof for powering of the micro-controller; and a proximity detector coupled to the micro-controller to send an object-detected signal thereto when the proximity detector detects presence of an object proximate the detector to change a mode of the electronic switch between an ON mode in which the AC device is to be powered and an OFF mode in which the AC device is not to be powered;

the micro-controller being coupled to the switching arrangement to control change of the switching arrangement into and out of its conductive state for selective recharging of the primary storage element after drawing of current therefrom and being coupled to the triac to effect triggering the triac after each time an AC voltage of the AC power line crosses through zero between AC half cycles when the electronic switch is in the ON mode and not effect triggering of the triac after each time the AC voltage crosses through zero between AC half cycles when the electronic switch is in the OFF mode.

The microcontroller may be arranged to put the switching arrangement into its conductive state for a partial portion of an AC half cycle of the AC power line and, when the switch is in its ON mode, trigger the triac outside of said partial portion of the AC half cycle.

Alternatively, there may be a higher voltage additional storage element coupled to the output of the rectifier to be charged by the DC voltage for drawing of energy from the additional storage element through the switching arrangement when the switching arrangement is in the conductive state.

When the additional storage element is used, preferably the microcontroller is arranged to put the switching arrangement into its conductive state in response to the charge in the primary storage element dropping below a predetermined level, and there may be provided an inductor coupled between the switching arrangement and the primary storage element and a reverse biased switching diode coupled to a system ground of the switch from between the switching arrangement and the inductor.

Preferably the microcontroller is arranged to change a delay from crossing of the AC voltage of the AC power line through zero to triggering of the triac when the switch is in the ON mode.

Preferably the microcontroller is arranged to effect an additional triggering of the triac within each AC half cycle when the current level through the triac drops below the minimum level required to maintain the conductivity thereof while the switch is in the ON mode. This re-triggering of the triac allows the switch to be used when the AC device comprises a compact fluorescent light bulb.

Preferably the microcontroller is connected across the terminals of the triac to monitor voltage levels at said terminals to determine when the AC voltage crosses through zero and when the current level through the triac drops below the minimum level required to maintain the conductivity of the triac with the switch in the ON mode. In this case, the microcontroller effects the additional triggering of the triac within each AC half cycle when the magnitude of the voltage across the main terminals of the triac climbs above a predetermined value indicating that the current through the triac has dropped below the minimum value required to maintain triac conductivity while the switch is in the ON mode.

Preferably the microcontroller is arranged to effect the additional triggering of the triac if the switch is in the ON mode and a voltage across the triac is increasing.

Preferably the microcontroller is arranged to reduce the delay from crossing of the AC voltage through zero to triggering of the triac if the triac is being triggered less than a predetermined number of times per AC half cycle. The microcontroller may compare the predetermined number against an average number of times the triac is triggered over multiple AC half cycles.

Where the additional storage element is used, the microcontroller is preferably arranged to wait for a voltage across the additional storage element to reach a predetermined level after the AC voltage crosses zero before effecting triggering of the triac and to change from a first value for this level to a lower second value for this level to reduce the delay from crossing of the AC voltage through zero to triggering of the triac.

Preferably the microcontroller controlling the switching arrangement and the triac additionally controls operation of the proximity detector.

Preferably there is provided a current limiter coupled between the switching arrangement and the primary storage element.

The current limiter may comprise a resistor.

Preferably there is provided a low current charging path coupled between the output of the rectifier and the primary storage element to provide an initial charge to the primary storage element when the electronic switch is first connected to the AC power source through the AC power line to allow sufficient charge to develop to facilitate microcontroller initialization.

Where the additional storage element is used, preferably the microcontroller is arranged to put the switching arrangement into its conductive state multiple times per AC half cycle.

Where the additional storage element is not used, preferably a transition softener coupled to the switching arrangement to gradually reduce a current level flowing back to the AC power line when the switching arrangement is changed from the conductive state to the non-conductive state, thereby facilitate safe use of the switch when the AC device is an inductive load.

The microcontroller may be arranged to change a delay from crossing of the AC voltage of the AC power line through zero to triggering of the triac when the switch is in the ON mode in response to input from a user in order to change a fraction of the AC half cycle in which the triac is triggered to form the conductive connection. This introduces a dimming control function to the switch for use when the AC device comprises an incandescent light bulb.

The microcontroller may be arranged to count the number of AC half cycles from a point where the switch entered the ON mode up to a predetermined value, at which point the microcontroller changes the switch back into the OFF mode. This introduces a timer operation to automatically turn off a device after a predetermined amount of time.

BRIEF DESCRIPTION OF THE DRAWINGS

In the accompanying drawings, which illustrate a exemplary embodiments of the present invention:

FIG. 9 is a schematic diagram illustration on/off intervals of the internal high voltage switch of the third embodiment light switch relative to an output voltage wave of a rectifier thereof drawing input current from the AC line to provide power for the switch.

FIG. 10 is a schematic diagram of the internal high voltage switch of the third embodiment light switch and a transition softener for same.

FIG. 11 is a schematic diagram illustrating timing of peak current draw of a compact fluorescent light relative to the output voltage wave of the rectifier of the third embodiment light switch.

DETAILED DESCRIPTION

Figure 1:
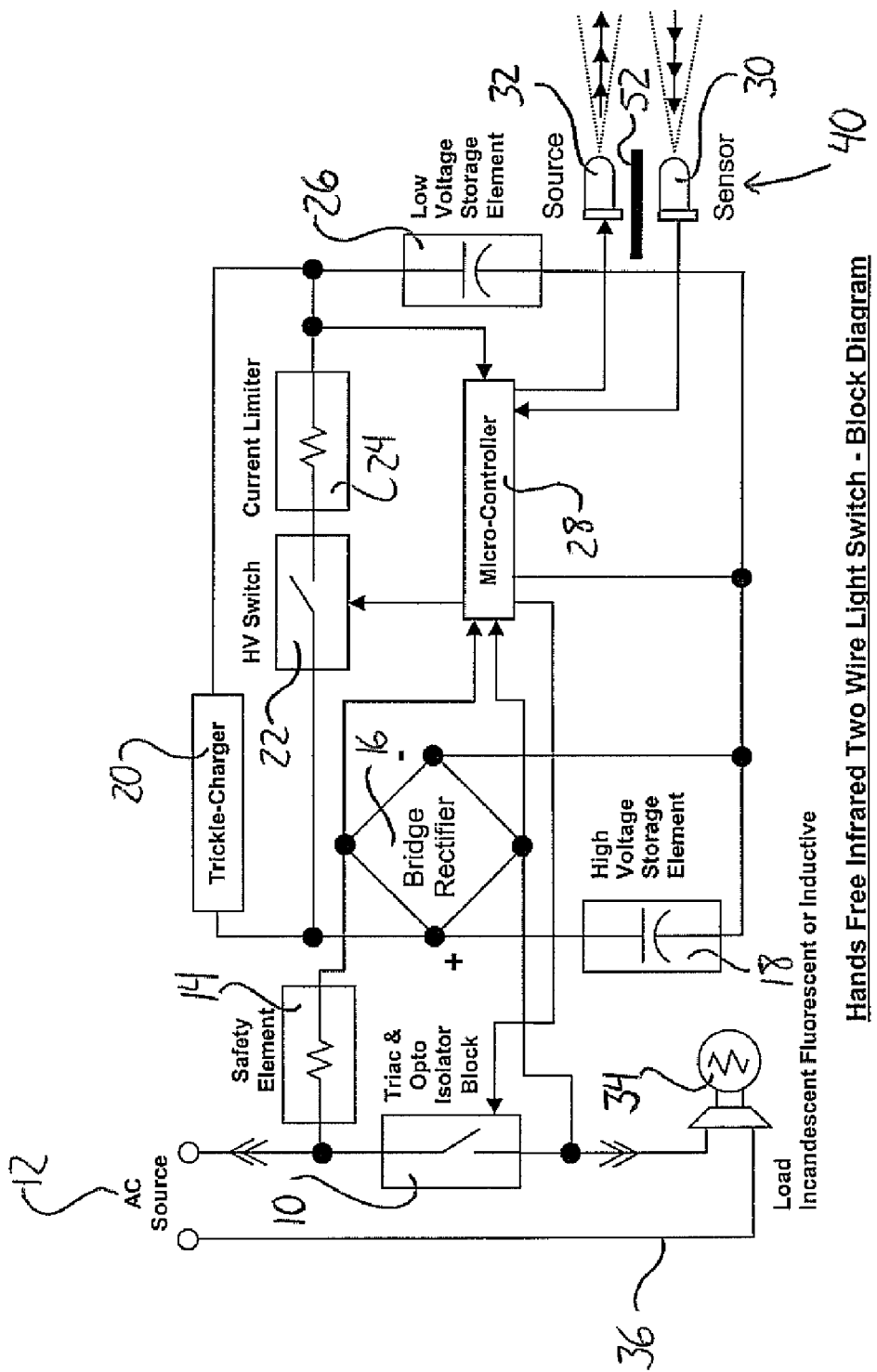
FIG. 1 is a block diagram of a first embodiment hands free infrared two wire light switch installed on an AC line in series with an illumination load for control thereof.

FIG. 1 illustrates a first embodiment system for controlling AC load using an electronic switch that incorporates a microcontroller and is actuated by a built-in proximity detector so that the electronic switch can be actuated without physical contact, for example requiring only that a hand (or other object) be positioned within a few inches of the switch to operate it.

The basic blocks of the installed first embodiment system consist of a connection to an Opto Isolator and Triac 10, an AC Source 12, Safety Element 14, Bridge Rectifier 16, High Voltage Storage Element 18, Trickle Charger 20, High Voltage (HV) Switch 22, Current Limiter 24, Low Voltage Storage Element 26, Micro Controller 28, an Infrared Sensor 30 and an Infrared Source 32.

The installed system inserts a lighting or other AC load 34 in series on an AC power line 36 with the AC Source 12 and the opto-isolator and triac combination 10 so that the triac, when triggered, conductively links the AC power source and load. As will be appreciated by those of skill in the art, the size of the triac will be dictated by the size of the load that is to be controlled and the opto-isolator provides the means of interfacing between low current outputs of the Micro Controller 28 and the drive current requirements of the Triac 10.

The means to accept outside input for actuation of the electronic switch in the illustrated embodiments comes by incorporating an Infrared Proximity Detector 40 using an infrared LED as the Source 32 and an infrared transistor as the Sensor 30. A single Micro Controller 16 runs the Proximity Detector routine, monitors and recharges a Low Voltage Storage Element 24 that powers the Micro Controller, and monitors and controls the Triac and Opto Isolator 14. Detection of an object by the proximity detector acts to toggle the electronic switch between ON and OFF modes or states, in which the AC load is powered and not powered respectively.

The electronic switch system connects to the AC Source 12 through the Safety Element 14 provided in the form of a low wattage resistor or fuse, for example a 10 ohm ⅛ to ¼ watt through hole resistor. In the event of a catastrophic system failure, this Safety Element will quickly cook off and permanently disconnect the system from the AC source 12. The Safety Element is connected from one of the main terminals on the triac 10 to one of the AC inputs of the bridge rectifier 16. The other input side of the bridge is connected to the other main terminal of the triac 10.

The negative output of the Bridge Rectifier acts as the system ground but floats with respect to earth ground, following closely the voltage of the AC Source 12. The positive output of the Bridge Rectifier 16 is connected to the Trickle Charger block 20, the High Voltage Storage Element 18 and the HV Switch 22. Current requirements through the Bridge 16 are not more than about 100 milliamps, but the voltage should be high enough to withstand any levels that may appear on the AC Source 12 including power line surges. 400 volts is a preferable minimum.

The High Voltage Storage Element 18 smoothes the rectified AC voltage into a more constant DC value. The voltage level here will be as high as 170 volts when the switch is off and as low as 10 volts when the switch is on. The 170 volts DC represents the peak value for the rectified AC while the 10 volt level is about how much voltage develops across the triac before it is triggered and starts passing current to the load. This HV storage element 18 stores whatever energy it can every AC half cycle. The Micro Controller 28 then draws energy from the HV Storage Element by putting the HV switch 22 into its conductive state when ever needed and for whatever length of time is required in order to maintain a stable level on the Low Voltage Storage Element and minimize voltage variations. Many short duration connections with the High Voltage Switch will result in a lower ripple voltage at the low voltage storage element than few connections for longer periods of time. The high voltage storage element may be a 200 to 300 volt 10 uF electrolytic capacitor.

Triac switched inductive loads typically require a snubber network (resistor in series with a high voltage capacitor across the main terminals of the triac) to avoid unintentional triac triggering due to rapid voltage rise. The first embodiment design does not require a snubber because the phase shift induced high voltage jump that occurs when the triac 10 stops conducting is absorbed by the High Voltage Storage Element 18. This effectively creates a snubber network that softens (reduces) the rapid voltage rise because the energy is absorbed by the charging of the High Voltage Storage Element 18 and subsequently used to power the system.

The Micro Controller monitors the voltage rise on the Low Voltage Storage Element 26 and turns off the HV Switch 22, putting it into a non-conductive state, when the Low Voltage Storage Element has been recharged. The period of time the HV Switch remains connected to the High Voltage Storage Element will depend on the voltage level of the High Voltage Storage Element. The Low Voltage Storage Element 26 may be provided in the form of a low voltage electrolytic capacitor, for example between 10 and 16 volts and around 100 micro farads.

The Trickle Charger block 20 provides a very low current path for energy to flow into the Low Voltage Storage Element 26. The Trickle Charger block is preferably sized to provide only enough charge to the Low Voltage Storage Element to enable the Micro Controller to initialize for the first time. For example, the Trickle Charger block may be provided in the form of a one Mega-ohm ⅛ watt resistor.

The Trickle Charge element 20 will continue to provide energy even after the Micro Controller 28 is operating, but this energy will only be a small portion of what the system requires on a continuous basis. Once voltage levels on the low voltage storage element 26 have climbed high enough, the Micro Controller, which draws its operating power from the Low Voltage Storage Element, boots up and takes over. From then on, the Micro Controller monitors the voltage levels on the Low Voltage Storage Element 26 and both main terminals on the triac 10 with respect to the system ground.

Figure 3:
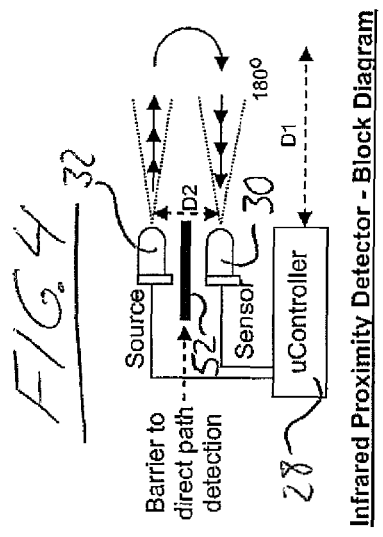
FIG. 3 is a schematic diagram of an internal high voltage switch of the first embodiment light switch.

The HV Switch can be constructed from any electronic components that provide adequate isolation during the disconnect period and allow sufficient current to flow into the system when energized. The HV Switch 22 of the first embodiment is built from a PNP transistor 42 and an NPN transistor 44 with three bias resistors, as shown in FIG. 3. This known switching arrangement allows the switch to operate over a wide range of High Voltage Storage Element levels and still be controlled by the Micro Controller.

The first embodiment uses a resistor as the current limiter 24 connected between the HV switch 22 and the low voltage storage element 26. In prototyping, a single ⅛ to ¼ watt 1.0 k resistor has defined an appropriate Current Limiter.

Figure 6:
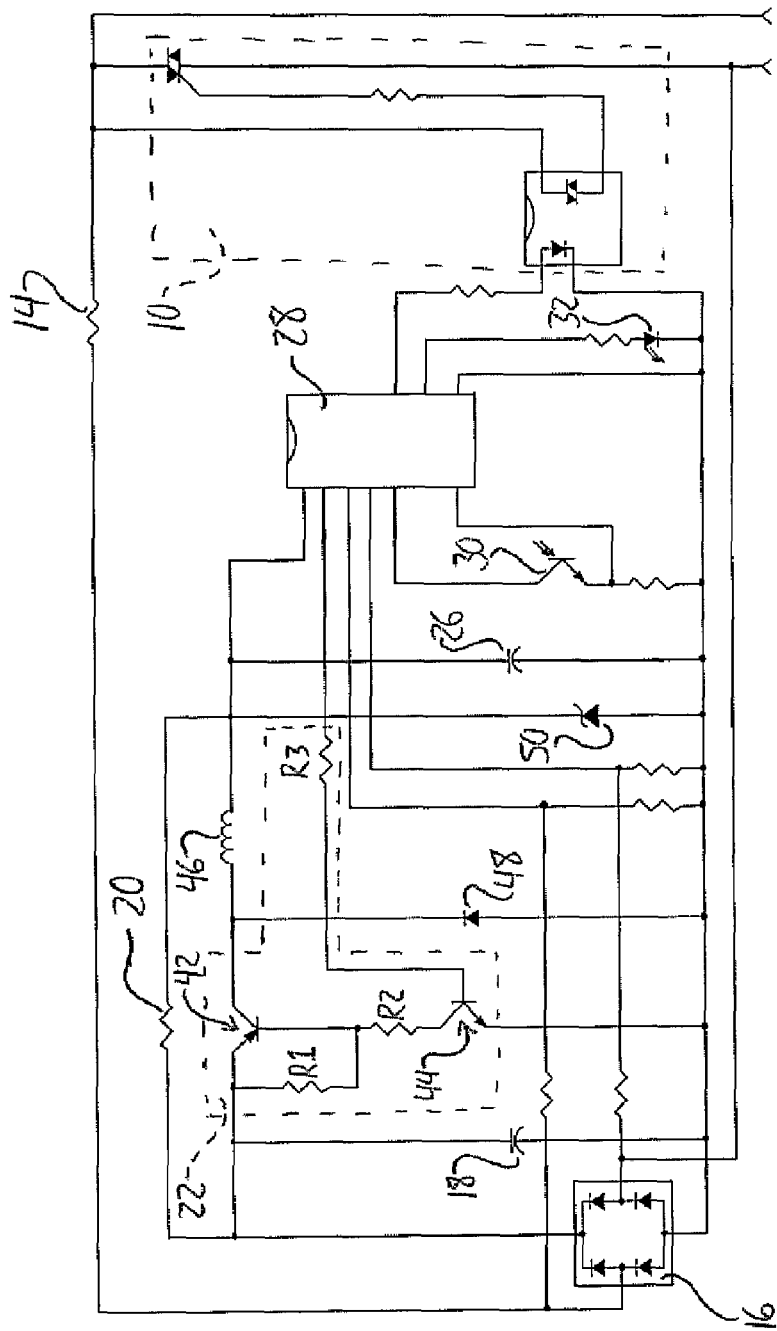
FIG. 6 is a circuit diagram of a second embodiment hands free infrared two wire light switch according to the present invention.

The circuit can be made to operate much more efficiently if this resistor is replaced with a 1 mH inductor, as illustrated by the second embodiment circuit diagram of FIG. 6. Using an inductor 46 and adding a back biased switching diode 48 between the connection of the HV switch 42 to the inductor 46 and the circuit ground creates a Buck Regulator Topology. This type of switching power supply will operate over a wide range of voltage levels on the HV Storage Element. The inductor 46 and switching diode 48 are additional expenses but greatly improve circuit efficiency. Pulse duration from the Micro Controller will have to be much shorter than with a resistive Current Limiter, and so the clocking speed of the Micro Controller may be a factor when a Buck Regulator Topology is used. In prototyping, an inductor capable of 50 to 100 mAmps has proven effective.

The Micro Controller chosen for the task must be able to monitor and control the system as described as well as perform any of the ancillary tasks the system was built to perform. A Micro Controller with wide tolerances to supply voltage fluctuations will allow the regulation of the Low Voltage Storage Element voltage to be less critical. One such example of a qualifying Micro Controller is the PIC16F676 by Microchip.

Figure 2:
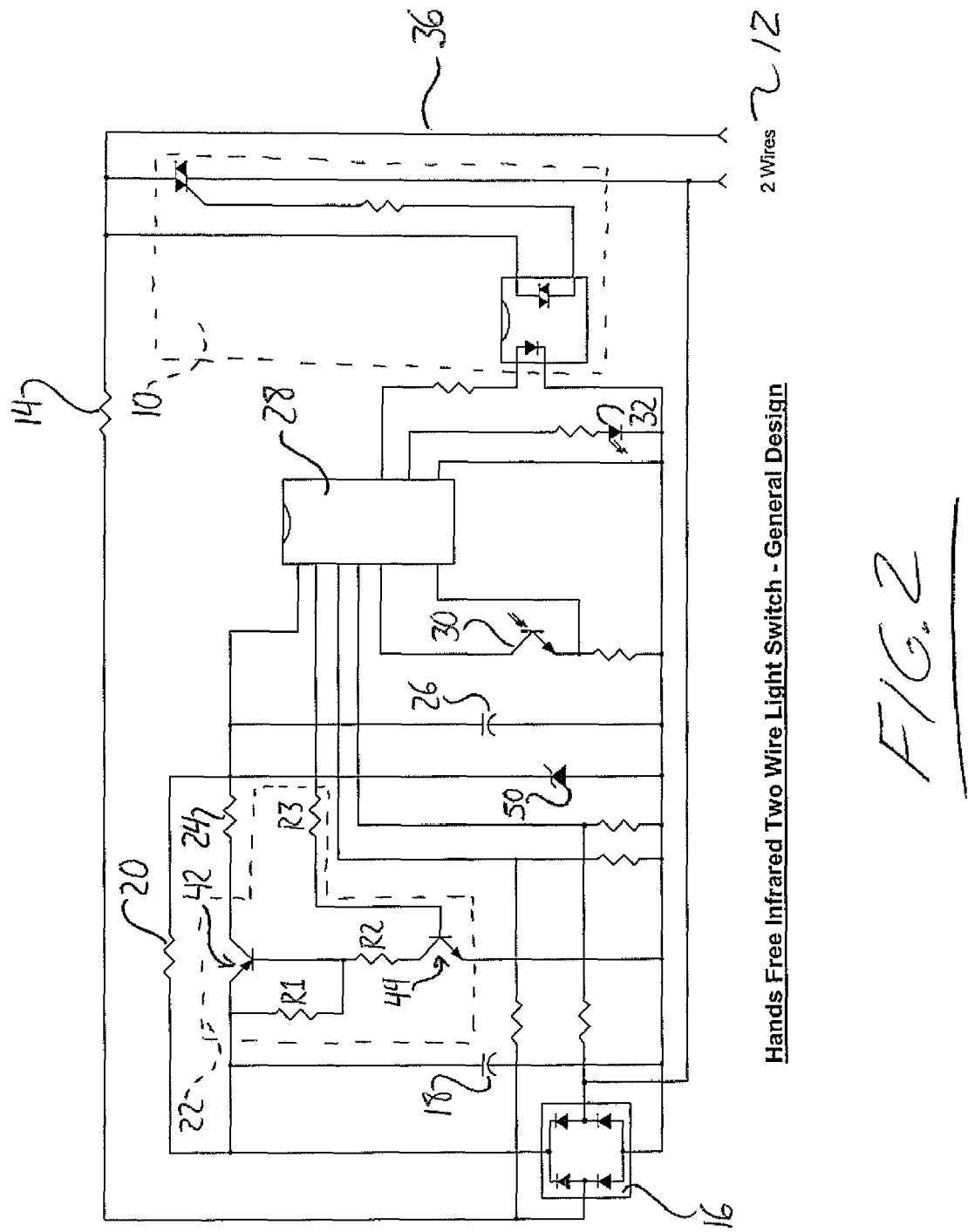
FIG. 2 is a circuit diagram of the first embodiment light switch.

Referring to FIG. 2, the illustrated embodiments feature a zener diode safeguard 50 placed across the Low Voltage Storage Element to provide a small amount of protection to the system. The zener diode voltage rating is selected to be above the Micro Controller's target value for the Low Voltage Storage Element but low enough to ensure that it is conducting before the Micro Controller's maximum voltage ratings are violated. Prototypes have relied upon a 5.6 volt ½ watt zener diode to provide this highly recommended safeguard. The use of a zener diode would give the Micro Controller some added time to react to an excessive voltage situation while minimizing the risks to the Micro Controller. The zener diode is especially useful during the design phase when Micro Controller operating code remains under development.

The Source 32 for the proximity detector of the illustrated embodiments is an infrared LED with a wavelength between 750 and 950 nanometers and a "viewing angle" of 20 degrees. A narrow viewing window ensures that several systems can be mounted next to each other with minimal likelihood of interference between systems. The Sensor 30 for the illustrated systems is an Infrared Transistor with an optical sensitivity matched to the same wavelength as the Infrared Source. It also has a narrow "viewing angle" around 20 degrees to help minimize interference from other units that may be installed nearby.

Figure 4:
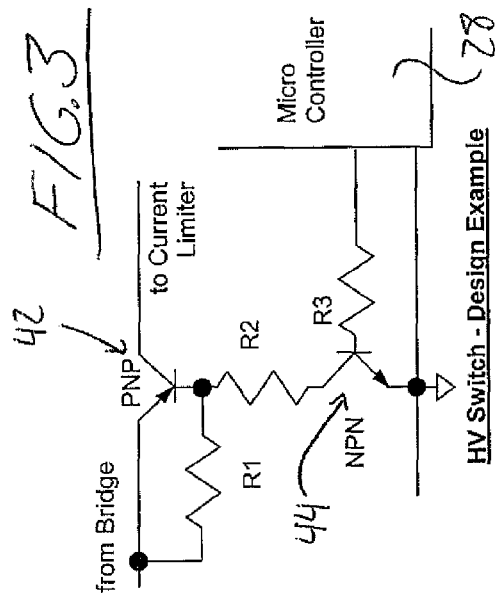
FIG. 4 is a block diagram of an infrared proximity detector of the first embodiment light switch.

The proximity detector formed by the cooperation of these Source 32 and Sensor 30 with the microcontroller 28 to detect the presence of an object, such as an operator's hand, proximate the electronic switch is preferably of the type described in applicant's copending application entitled "SYSTEM AND METHOD FOR DETECTING THE PRESECENCE OF AN OBJECT", Ser. No. 12/501,003, filed Jul. 10, 2009, and herein incorporated by reference. The detector, shown in FIG. 4, has the sensor (receiver) and like style source (transmitter) oriented so that the emanations of the source are angled (focused) 180 degrees to the angle (focal path) of the sensor while the two units are mounted in close proximity to each other. A barrier 52 positioned between the source and sensor to prevent them from communicating directly, to ensure that energy emitted by the source is only received by the sensor under reflection of source-emitted energy from an object. The object detection process described in the aforementioned application uses comparison of multiple readings from the sensor against expected measurement changes, as opposed to conventional detection techniques comparing individual measurements against a predetermined threshold. This reduces the likelihood of a false-positive detection result happening because of errant infrared signals from outside sources being received by the sensor and interpreted as reflected signals originating from the detector's source.

It will be appreciated that other proximity detector configurations and routines suitable for control by a Micro Controller may alternatively be used in the electronic switch of the present invention. As alternatives to an infrared transmitter and receiver pairing, ultrasonic or radio frequency (RF) transmitter/receiver pairings could be used, but wouldn't be as compact or cost effective, and would consume more power to operate.

Due to its need to have a minimum level of current passing through it to remain conductive after being initially triggered, the triac needs to be triggered after each an every time the AC voltage passes through zero as long as the electronic switch is in its ON mode in which the AC load is to be powered. The Micro Controller therefore monitors the voltage across the triac to determine when this zero crossing of the AC voltage waveform occurs, so that the Micro controller can send a gate pulse to the opto-isolator/triac block to trigger the triac after this zero crossing if the switch system is in the ON mode. AC lines can be quite noisy especially when several noisy CFLs are connected through the same circuit breaker to parallel switches. A noisy circuit could have many near the actual crossing. The Micro Controller comparing the voltages on the two pins and looking for a polarity reversal to mark the zero crossing may therefore reset a timer every time the voltage changes polarity. If the timer overflows (for example, after about 64 uSeconds) without any further polarity changes the system declares the zero crossing point as having just occurred.

Until recently, most household switch loads were either resistive or inductive, such as incandescent lights or bathroom fans. But a new type of load comes with the recent introduction and sudden popularity of CFLs (Compact Fluorescent Lamps). CFLs do not conduct current until the AC voltage has almost reached its peak value. Then the CFL draws a burst of current for about 1 milli second and quickly returns to a very low current state until the AC voltage peaks again, as schematically illustrated in FIG. 11. CFLs create two challenges for this design.

ONE) During the very low current periods the CFL acts as a very high impedance. This greatly increases the charge time required for the system to replenish the High Voltage Storage Element during each AC ½ cycle by limiting the current that can be drawn across the CFL.

TWO) The electronic switch (Triac) requires a minimum amount of current to flow across its main terminals to remain conductive. The high impedance aspect of the CFL during most of the AC ½ cycle does not meet this requirement causing the Triac to constantly shut itself off.

To mitigate the problem of the triac turning off part way though the AC ½ cycle, the Micro Controller monitors the voltage across the triac and ensures it is retriggered when necessary. For example, a voltage above 3 volts across the main terminals of the triac is a good indication that the triac has stopped conducting.

When the load is a low wattage Compact Florescent Lamp that requires constant triggering of the triac to keep the triac conductive when the switch is in an ON state, the energy drain on both Storage Elements can still be minimized. The Micro Controller needs only to pulse the Opto Isolator and Triac block for 20 to 50 microseconds each time. This will often cause the Triac to conduct for 400 microseconds or more even if it's during the extremely high impedance part of the CFL cycle. The Micro Controller then monitors the main terminals of the triac to see if additional pulses are required.

The microcontroller adjusts the length of the delay from the AC voltage zero crossing between AC half cycles to the first triac triggering per AC half cycle in order to better provide a balance between the power delivered to the AC load and the power requirements of the electronic switch. The high voltage storage element 18 needs to store sufficient charge per AC half cycle so that the Micro Controller 28 can cause energy to be pulsed though the inductor and into the low voltage storage element 26 by activating the HV switch 22 when required, and as often as required, during the AC half cycle. Since the charge on the high voltage storage element 18 builds up during the delay between the AC zero crossing and the first triggering of the triac in each half cycle, the charge built up on the high voltage storage element 18 is related to this delay. A longer delay means more charging time for the high voltage storage element per AC half cycle, but less power to the load per AC half cycle.

The micro-controller switches between two different predetermined values associated with this delay from the zero crossing to the first triac gate pulse. The micro controller watches the voltage between the two pins of the high voltage storage element. When the electronic switch is put into the ON mode, the micro controller waits from the first zero crossing until this voltage across the HV storage element pins reaches a higher one of the two predetermined values, for example 30 volts. Once the voltage reaches this value the system declares the gatedelay complete (i.e. the HV Cap now has sufficient charge on it) and fires the triac for the first time. The actual time delay associated with this voltage increase depends on the AC load. For example, a bathroom fan will cause the voltage rise to be very fast and the gatedelay to therefore be very short, while a CFL bulb could take as much as 2 milli seconds to reach a level of about 30 volts. The system then monitors the number of gate pulses used in each AC half cycle and averages them out over multiple cycles, for example over about a one second time frame. If, on average, more than one gatepulse was required per AC half cycle, as would be expected when the AC load is a CFL, then the system leaves the gatedelay voltage setting at 30 to ensure sufficient charge buildup to meet the power requirements for multiple gate pulses per half cycle. On the other hand, if the system determines that the average number of gate pulses per AC half cycle was less than two, it lowers the voltage setting to the lower one of the two predetermined values, for example to 14 volts, as a single triac gate pulse per half cycle will not require as high a charge on the high voltage capacitor. These exemplary values for the gatedelay voltage setting were determined through experimentation, and testing has resulted in 99% power delivered to the AC load for incandescent and inductive loads.

The power delivered to the load can be optimized by the system by a) determining what kind of load is involved, and b) triggering the triac as soon as possible after ensuring that sufficient power is gleaned to run the system.

Figure 12:
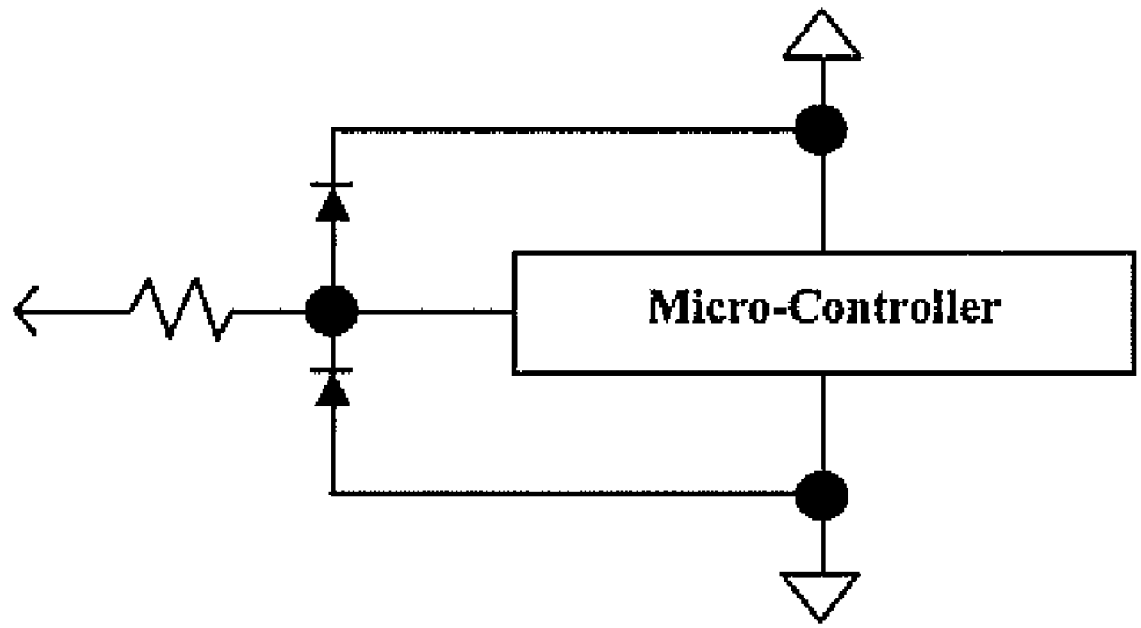
FIG. 12 illustrates an input protection arrangement for the microcontroller.

To minimize the recharge requirements, ancillary loads such as indicator lights can be avoided or kept to a minimum and the Micro Controller can enter a "Sleep" mode when ever possible. Proper precautions should be employed to protect the Micro Controller inputs by limiting current flow and ensuring the Micro-Controller input voltage levels are never exceeded. Such precautions can be accomplished by placing resistors in series with the Micro-Controller inputs and reverse biased diodes between the inputs and the Micro Controller +ve and −ve supply terminals. This arrangement is illustrated in FIG. 12. Many microcontroller models already have the diodes built in as part of their design.

To minimize the parts count, the Micro Controller of the illustrated embodiment has a self contained oscillator, a small amount or RAM, the ability to perform Analog to Digital conversion on multiple inputs, the ability to operate over a wide range of supply voltages, brown out detection circuitry, and built in ESD (electrostatic discharge) diode protection on all input/output pins.

The present invention can be used on almost any AC system, including 24 volts, 120 volts or 240 volts AC. Furthermore, it is not constrained to 60 Hz. This design can be modified for 50 Hz or even 400 Hz operation. All conductive parts of this system have dangerous, even lethal, voltage levels with respect to earth ground. Proper precautions must be observed at all times.

In prototypes of the above embodiment, the buck regulator topology has provided efficient reduction of 170 Volts DC to about 3.5 without losing energy across a resistive current limiter. With a value of 3.5 volts for the microcontroller working voltage and the HV storage capacitor voltage with the switch off, the microcontroller consumes much less power than what is consumed at 5 volts.

Preferably the infrared sensors are biased in their non-linear regions to pass less current and consume significantly less power.

Micro Controller Routines

The Micro Controller runs several routines, including:

Initialization
  Power up and set system operating parameters.
Main Loop
  When the switch is ON—Adjust the time delay before firing the triac for the best balance between the most power delivered to the load and the minimum energy requirements of the switch.
  Periodically measure the Low Voltage Storage Element and reconnect the HV Switch to replenish the voltage as required, preferably multiple times per AC half cycle after a relatively small drop in voltage in an effort to minimize Micro Controller supply voltage ripple.
  Trigger the Triac and Opto Isolator Block if switch in ON.
  Monitor voltage across the main pins of the triac, retrigger if the voltage is climbing and the switch is ON.
  Run the Proximity Detect Routine.
  Toggle the switch state between ON and OFF modes if an object is detected.
    If toggled, disable the Proximity Detection routine for the next two seconds.
  Go to sleep.
  Wake from sleep at the zero crossing point of the AC Source.
  Go to "Main Loop".

Temporarily disabling or terminating the detection routine Invokes an ignore period immediately following confirmation of an object's presence to give time for the detected object to move away. This minimizes the risk of multiple changes of the switch's state by repeated detection of a slow moving hand.

Alternate Embodiment

Figure 7:
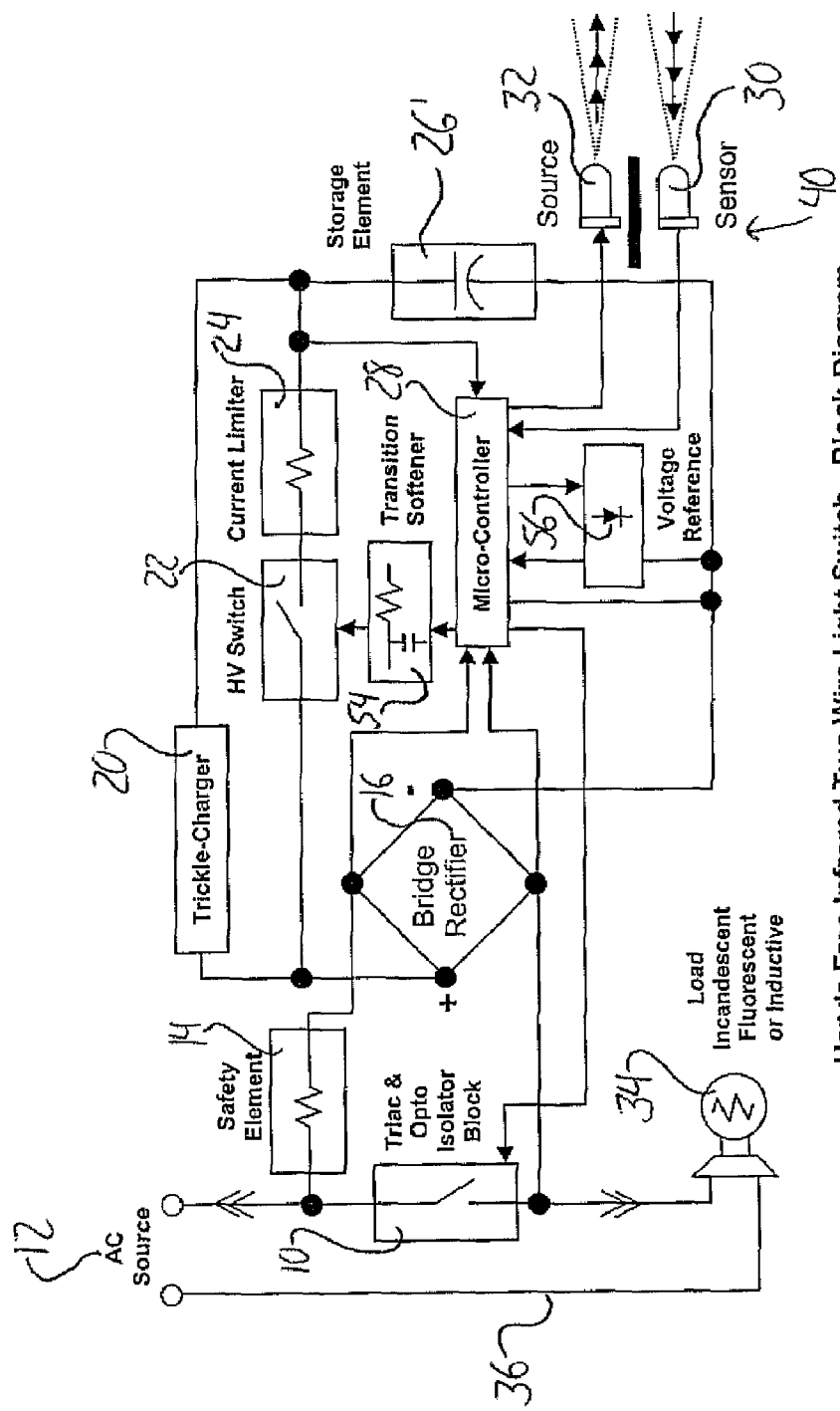
FIG. 7 is a block diagram of a third embodiment hands free infrared two wire light switch installed on an AC line in series with an illumination load for control thereof.
Figure 8:
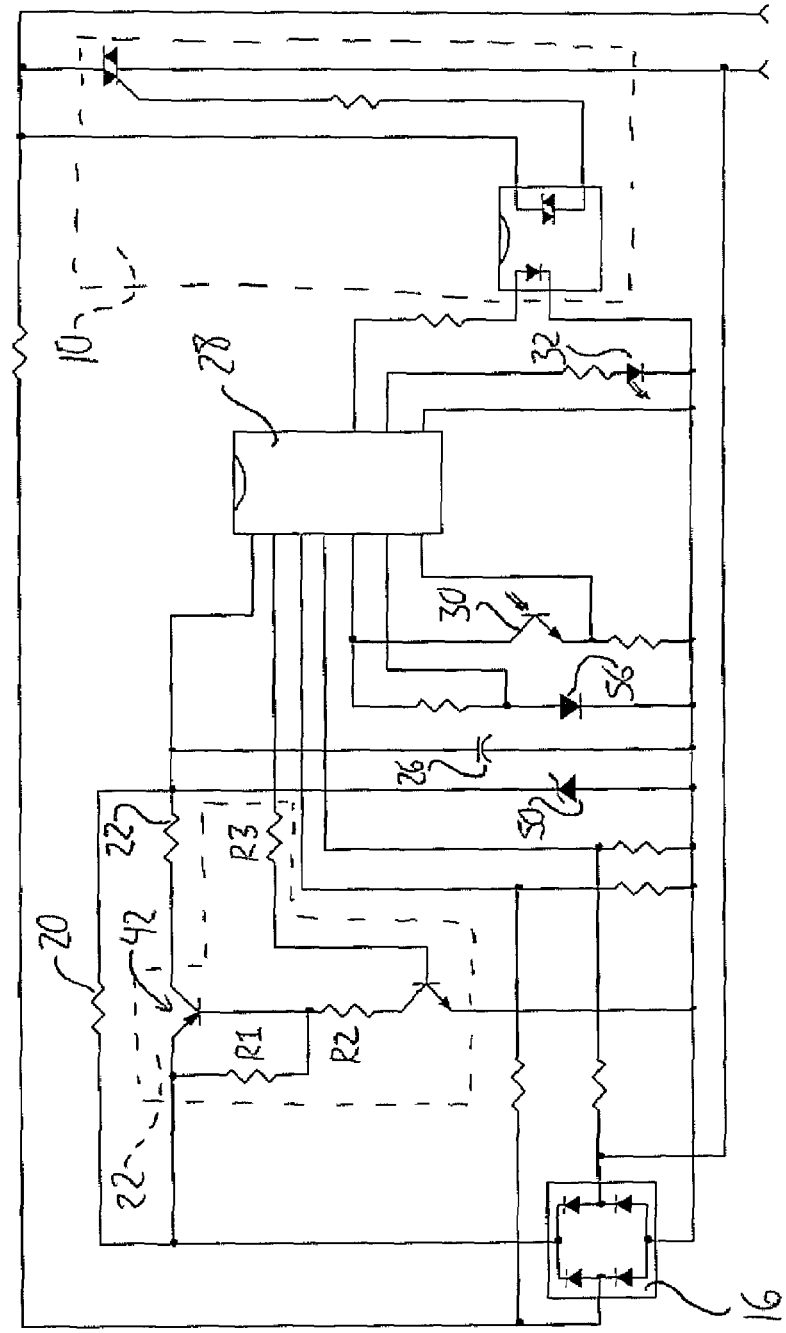
FIG. 8 is a circuit diagram of the third embodiment light switch.

FIGS. 7 and 8 show a third embodiment having no high voltage storage element like the first two embodiments of FIG. 1 to 6, instead having only a sole storage element 26' corresponding to the low voltage storage element 26 of the first two embodiments. Without a second high voltage storage element connected the positive output of the rectifier 16 to store a charge from which the microcontroller-powering storage element 26' can draw at any time during an AC half cycle, the HV switch 22 in this embodiment can only be put into its conductive state for charging the sole storage element 26' during the initial portion of each AC half cycle between the zero crossing at the start thereof and the first triac triggering when the switch is in the ON mode. Therefore, the microcontroller in this embodiment does not put the HV switch 22 into its conductive state in response to dropping of the microcontroller-powering storage element 26' below a predetermined value like the first two embodiments, but instead puts the HV switch 22 into its conductive state in response to the AC voltage crossing through zero. After the initial portion of the AC half cycle, the HV switch 22 is put back into its non-conductive state and the triac is accordingly triggered for the first time for that half cycle. This turning on of the HV switch 22 only during an initial partial portion of each half cycle when the switch is in the ON mode is shown in FIG. 9 relative to the DC voltage at the positive output of the rectifier. The remainder of the half cycle where the HV switch 22 is off represents the time during which the triac is to be triggered and maintained in its conductive state when the switch is in the ON mode to deliver power the AC load. Through testing of prototypes, the typical conduction angle spans from approximately 10 degrees to 180 degrees, for a total of approximately 170 degrees through which the AC load device is powered through the triggered triac.

When the Micro-Controller senses that the AC line is at or near zero volts, the Micro Controller will know that the AC Source is entering the zero crossing point. This is the point in time where the instantaneous voltage across the two terminals has dropped to zero volts and is about to reverse polarity. The rectified AC voltage will then rise from zero volts at a known rate. The Micro Controller now energizes the HV Switch. This connects the positive side of the Bridge Rectifier to the Storage Element via the Current Limiter. As the AC Source voltage increases in magnitude, current begins to flow through the Bridge Rectifier, across the HV Switch, through the Current Limiter and into the Storage Element. In about 100 micro seconds the voltage on the positive side of the Bridge Rectifier will climb from zero to above 12 volts with respect to the negative bridge terminal. Current will be held back by the Current Limiter but will continue to increase in response to the increasing Bridge Rectifier voltage. The Micro Controller monitors the voltage rise on the Storage Element and turns off the HV Switch when the Storage Element has sufficient reserve energy to supply the system with operating power until the next AC ½ cycle. The AC Voltage will continue to rise to near 170 volts peak (120 Volts RMS) with the HV Switch open. The Micro Controller monitors system power consumption by tracking Storage Element voltage levels between AC ½ cycles and computing a correction to the HV Switch connection time for the next AC ½ cycle.

The impedance of the Load 34 will have an affect on the Storage Element charge rate. The Micro-Controller will have to track this and compensate where required. It will be able to do this by monitoring the voltage on the AC pins of the Bridge Rectifier and by monitoring the Storage Element voltage. It will be able to gauge how the charging cycle is performing and adjust the length of time the HV Switch remains connected every AC ½ cycle. Furthermore, the HV Switch connection time will be different when the Switch is OFF as opposed to the Switch being ON. The Micro-Controller will need to track and adjust the HV Switch connection times for each situation. Also, the Micro-Controller must compensate quickly for load changes so that the Storage Element is not overcharged. And, at the other end of the voltage requirements, it must also ensure the Storage Element voltage is high enough to avoid a brown out situation where the Micro-Controller abandons all functions and reboots.

To gauge the Storage Element voltage, the Micro Controller needs to compare it to a Voltage Reference. A forward biased diode 56 provides a reference that is stable enough for this purpose. The actual voltage will depend on the diode chosen and the amount of bias current applied but should result in a value between 0.4 and 0.6 volts. By connecting the diode drive resistor to one of the Micro Controller's outputs and measuring the voltage across the diode with a second port that is an Analog to Digital port, the Micro Controller can turn the Voltage Reference on and take measurements only when needed and thereby save system power.

Despite the lack of a high voltage storage element in this embodiment, a dedicated snubber is still not required for inductive loads, as the phase shift induced high voltage jump that occurs when the triac stops conducting, is absorbed by another part of the system. The microcontroller knows when the triac will shut off due to zero current and commands the HV Switch to connect prior to that moment. This effectively creates a snubber network that softens (reduces) the rapid voltage rise because the energy is absorbed by the charging of the Storage Element 26'.

The third embodiment also differs in that a Transition Softener 54 comprised of a resistor 54a in series with a capacitor 54b to ground are used between the Micro Controller 28 and the HV Switch 22 to keep the HV Switch 22 from abruptly turning on or off in response to a high or low from the Micro Controller. The Transition Softener is basically a low pass filter and in most situations it is not required unless the load is inductive. Inductive loads present a challenge when the switch is in an OFF state because the switch draws a small amount of current to replenish the charge on the Storage Element 26'. This small amount of current can result in a large voltage spike (several hundred volts) when the charge abruptly shuts off. This voltage spike can be avoided if the current through the load is slowly reduced to zero.

Like for the first two embodiments, the Current Limiter may be constructed by using something as simple as a resistor. The Storage Element is typically a capacitor whose size is based on the load requirements of the system between each AC half cycle as well as the tolerable variations in storage voltage levels from the conclusion of a charge period until the beginning of the next charge period. This is often referred to as supply voltage ripple. If the operational load varies from one AC half cycle to the next, the Micro Controller will have to account for the variations and adjust the connection time accordingly. Because the HV Switch disconnects the Current Limiter and Storage Element before the voltage levels grow too high, the voltage rating for the Storage Element does not need to be much greater than the operating voltage for the Micro Controller. In prototyping, a ⅛ to ¼ watt through-hole resistor of 470 ohms was used.

The HV switch of the third embodiment has the same construction of the first two embodiments. However, the HV Switch can be constructed from any electronic components that provide adequate isolation during the disconnect period and allow sufficient current to flow into the system when energized. Component selection will depend on power requirements of the system but should all have a voltage rating above the peak voltage expected on the bridge.

The Micro controller routines for the third embodiment differ from that of the first two embodiments only in the replacement of the first two routines of the main loop being replaced by the following two routines:

Recharge the Storage Element by activating the HV Switch for a period of time.

Measure the Storage Element voltage level and adjust the HV Switch connection time accordingly If tighter voltage control is required by the system, the Storage Element could be charged to a higher level and a standard three terminal voltage regulator inserted between the Storage Element and the rest of the system. This will cause the system to consume more power and require more time to charge each AC ½ cycle but there will be less demand on the Micro Controller to monitor and regulate the voltage feed to the three terminal voltage regulator and the output will be a very stable voltage.

If a fixed value voltage regulator is used in the design then the supply voltage will be of a known value. In this case the Voltage Reference will not be required. Instead the Voltage Reference diode would be replaced by a resistor. The Voltage Reference drive resistor would have its one connection moved from the output of the Micro Controller and connected directly to the Storage Element. This would create a voltage divider that would bring the measured voltage down to level within the Analog to Digital input allowable range. The Micro Controller would then only have to extrapolate from this measured value to determine the actual voltage on the storage element.

Additional Functions Not Requiring Additional Parts

Timed Operation—The Micro Controller can easily be programmed to time itself and turn Off after a prescribed period. This function could be enabled and its settings adjusted by holding a hand (or other object) in front of the sensor for various extended periods of time where each period would result in a different setting. As an example, a one minute continuous scan would enable a 10 minute timer, two minutes continuous would enable a 20 minute timer, 3 minutes for a 30 minute timer and four minutes would disable all timer functions. The system could lock these settings into its internal memory and apply them every time the switch is activated or until an extended scan period causes the settings to be changed.

Dimmer Operation—The Micro Controller can also be programmed to delay triac triggering in order to introduce a dimming function for incandescent light bulbs. As with the Timed Operations, the amount of dimming can be determined by the length of time one's hand remains in front of the sensor. An initial detection turns the switch on. If the switch still detects the hand a moment later it starts to increase the delay in triac triggering and thereby dim the lights. The longer the hand remains in front of the sensor the dimmer the light will become until it reaches a predetermined minimum where the process pauses and then starts to reverse the delay. After this, the switch will remember the setting and apply it every time the switch is toggled on until an extended scan period causes the settings to be changed. It should be noted that this technique would not work with CFLs because their characteristics are not linear.

Figure 5:
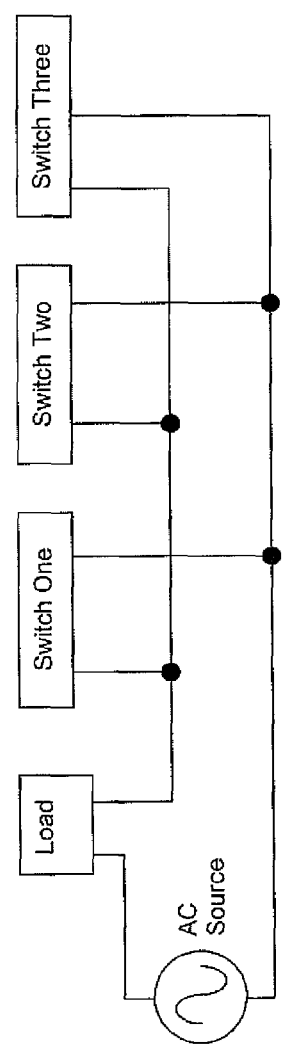
FIG. 5 is a schematic diagram illustrating a multiple light switch connection architecture using light switches of the first embodiment.

Three Way Switch (Or Four Way or more)—Multiple switches can be connected in parallel, as shown in FIG. 5, to provide lighting control from several locations. The first switch to be activated would energize its triac on every AC half cycle. After that, any of the switches could turn the lights off. They all monitor the voltage on the line and any other switch which detects an object could instruct the first switch to toggle off by firing its own triac early in the AC ½ cycle. The first switch (the one that turned the light On) will note the absence of the expected voltage rise on the line and interpret this as a signal from one of the other switches to toggle off.

All of the foregoing additional functions are possible with minor modifications to the operating code in the Micro Controller and without the need for any additional hardware.

Additional Functions Requiring Additional Parts

Indicator LED—A visible light LED can be connected to the Micro Controller via a current limiting resistor to provide a visual indication of where the switch is located in a darkened room. Its brightness can be regulated by the length of time the Micro Controller provides it power each AC half cycle. The LED could even be turned off when the switch is turned on to distinguish itself from other switches that may be mounted adjacent to it. The designer will have to determine the appropriate brightness level for the visible LED. Power that will be consumed by the LED has implications for the efficiency of the system.

In the following claims, the term primary storage element is used to refer to the storage element common to all the above described embodiments (i.e. that from which the microcontroller directly draws power: the low voltage storage element in the first or second illustrated embodiment using two storage elements, or the sole storage element in the third illustrated embodiment). The term additional storage element accordingly refers to the storage element directly coupled to the output of the rectifier in embodiments using two storage elements (i.e. the high voltage storage element in the third embodiment).

Since various modifications can be made in my invention as herein above described, and many apparently widely different embodiments of same made within the spirit and scope of the claims without department from such spirit and scope, it is intended that all matter contained in the accompanying specification shall be interpreted as illustrative only and not in a limiting sense.

The invention claimed is:

1. An electronic switch for selective control over power to be applied to an AC device from an AC power source through an AC power line comprising:
   a pair of terminals configured to connect to the AC power line in series between the AC power source and the AC device without any additional connection of the electronic switch to an external ground;
   a triac coupled between the pair of terminals to form a conductive connection therebetween when triggered by a gate pulse and retain said conductive connection between the terminals until a current level through the triac drops below a minimum level required to maintain conductivity of the triac;
   a rectifier coupled to the terminals to generate a rectified DC voltage at an output of the rectifier when the pair of terminals are connected to the AC power line;
   a switching arrangement coupled to the output of the rectifier;
   a primary storage element coupled to the switching arrangement to build a charge in the primary storage element when the switching arrangement is in a conductive state between the rectifier output and the primary storage element;
   a micro-controller coupled to the primary storage element to draw current from the charge thereof for powering of the micro-controller, linked to triac to effect triggering thereof, coupled to the terminals of the triac to monitor conditions thereacross, and coupled to the switching arrangement to effect control thereof; and
   a proximity detector coupled to the micro-controller to send an object-detected signal thereto when the proximity detector detects presence of an object proximate the detector to change a mode of the electronic switch between an ON mode in which the AC device is to be powered and an OFF mode in which the AC device is not to be powered;
   wherein the microcontroller is configured to execute one or more routines which, when executed, cause the microcontroller to:
   control change of the switching arrangement into and out of its conductive state for selective recharging of the primary storage element after drawing of current therefrom, effect an initial triggering the triac after each time an AC voltage of the AC power line crosses through zero between AC half cycles when the electronic switch is in the ON mode, not effect the initial triggering of the triac after each time the AC voltage crosses through zero between AC half cycles when the electronic switch is in the OFF mode, monitor the conditions across the terminals of the triac and, while the switch is in the ON mode, effect an additional triggering of the triac within each AC half cycle in response to any reading of the monitored conditions after the initial triggering that is indicative of a drop in the current level through the triac to a value below the minimum level required to maintain the conductivity of the triac.

2. The electronic switch according to claim 1 comprising a higher voltage additional storage element coupled to the output of the rectifier to be charged by the DC voltage for drawing of energy from the additional storage element through the switching arrangement when the switching arrangement is in the conductive state.

3. The electronic switch according to claim 2 wherein the microcontroller is configured to put the switching arrangement into its conductive state in response to the charge in the primary storage element dropping below a predetermined level.

4. The electronic switch according to claim 1 wherein the microcontroller is configured to change a delay from crossing of the AC voltage of the AC power line through zero to the initial triggering of the triac when the switch is in the ON mode.

5. The electronic switch according to claim 1 wherein the microcontroller is configured to put the switching arrangement into its conductive state for a partial portion of an AC half cycle of the AC power line and, when the switch is in its ON mode, trigger the triac outside of said partial portion of the AC half cycle.

6. The electronic switch according to claim 1 wherein the one or more routines of the microcontroller includes a proximity detector routine that performs an object detection process using the proximity detector.

7. The electronic switch according to claim 1 comprising a current limiter coupled between the switching arrangement and the primary storage element.

8. The electronic switch according to claim 7 wherein the current limiter comprises a resistor.

9. The electronic switch according to claim 2 comprising an inductor coupled between the switching arrangement and the primary storage element and a reverse biased switching diode coupled to a system ground of the switch from between the switching arrangement and the inductor.

10. The electronic switch according to claim 1 comprising a low current charging path coupled between the output of the rectifier and the primary storage element to provide an initial charge to the primary storage element when the electronic switch is first connected to the AC power source through the AC power line to allow sufficient charge to develop to facilitate microcontroller initialization.

11. The electronic switch according to claim 4 wherein the microcontroller is configured to reduce the delay from crossing of the AC voltage through zero to the initial triggering of the triac in response to a determination from the measured conditions that the triac is being triggered less than a predetermined number of times per AC half cycle.

12. The electronic switch according to claim 11 wherein the microcontroller is configured to compare the predetermined number against an average number of times the triac is triggered over multiple AC half cycles.

13. The electronic switch according to claim 11 comprising a higher voltage additional storage element coupled to the output of the rectifier to be charged by the DC voltage for drawing of energy from the additional storage element through the switching arrangement when the switching arrangement is in the conductive state, wherein the microcontroller is configured to wait for a voltage across the additional storage element to reach a predetermined level after the AC voltage crosses zero before effecting the initial triggering of the triac and to switch from a first value for this level to a lower second value for this level to reduce the delay from crossing of the AC voltage through zero to the initial triggering of the triac.

14. The electronic switch according to claim 1 wherein the microcontroller is configured to effect the additional triggering of the triac when the switch is in the ON mode and the measured conditions indicate that a voltage across the triac is increasing.

15. The electronic switch according to claim 2 wherein the microcontroller is configured to put the switching arrangement into its conductive state multiple times per AC half cycle.

16. The electronic switch according to claim 5 comprising a transition softener coupled to the switching arrangement to gradually reduce a current level flowing back to the AC power line when the switching arrangement is changed from the conductive state to the non-conductive state.

17. The electronic switch according to claim 1 wherein the microcontroller is configured to monitor voltage levels at said terminals to determine when the AC voltage crosses through zero and determine when the current level through the triac drops below the minimum level required to maintain the conductivity of the triac.

18. The electronic switch according to claim 1 wherein the microcontroller is configured to monitor voltage levels at said terminals to determine when the AC voltage crosses through zero and when the current level through the triac drops below the minimum level required to maintain the conductivity of the triac with the switch in the ON mode, and the microcontroller is configured to effect the additional triggering of the triac within each AC half cycle when the magnitude of the voltage across the main terminals of the triac climbs above a predetermined value indicating that the current through the triac has dropped below the minimum value required to maintain triac conductivity while the switch is in the ON mode.

19. The electronic switch according to claim 1 wherein the microcontroller is configured to change a delay from crossing of the AC voltage of the AC power line through zero to the initial triggering of the triac when the switch is in the ON mode in response to user input to the proximity detector in order to change a fraction of the AC half cycle in which the triac is triggered to form the conductive connection.

20. The electronic switch according to claim 1 wherein the microcontroller is linked to the triac by an opto isolator therebetween.

\* \* \* \* \*